US009526162B2

(12) United States Patent
Jung et al.

(10) Patent No.: US 9,526,162 B2
(45) Date of Patent: Dec. 20, 2016

(54) BOARD ASSEMBLY (71) Applicant: Samsung Electronics Co., Ltd., Gyeonggi-do (KR)

(72) Inventors: Min-Su Jung, Seoul (KR); Sang-Hyeon Kim, Gyeongsangbuk-do (KR); Young-Tae Kim, Seoul (KR); Hong-Beom Kim, Daegu (KR); Il-Sung Jeong, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 385 days.

(21) Appl. No.: 14/104,266

(22) Filed: Dec. 12, 2013

(65) Prior Publication Data

US 2014/0307410 A1    Oct. 16, 2014

(30) Foreign Application Priority Data

Apr. 10, 2013  (KR) .......................... 10-2013-0039257

(51) Int. Cl.
*H05K 9/00* (2006.01)
*H05K 1/02* (2006.01)
*H04M 1/02* (2006.01)
*H05K 3/30* (2006.01)

(52) U.S. Cl.
CPC ......... *H05K 1/0216* (2013.01); *H04M 1/0277* (2013.01); *H05K 3/301* (2013.01); *H05K 2201/10159* (2013.01); *H05K 2201/10371* (2013.01)

(58) Field of Classification Search
CPC .. H05K 5/0091; H05K 5/0256; H05K 5/0291; H05K 7/1427; H05K 7/1448; H05K 7/1461; H05K 9/0032; H05K 9/0067; G06K 7/0047; A61M 2209/088; G11B 33/123; G11B 33/126; G11B 33/127; G11B 33/128; B29L 2031/3481; B29L 2031/3431
See application file for complete search history.

(56) References Cited

U.S. PATENT DOCUMENTS 5,319,516 A * 6/1994 Perkins ................ G06K 13/077
                                                          361/220
5,710,693 A * 1/1998 Tsukada .................... G06F 1/16
                                                         361/679.32
6,075,706 A * 6/2000 Learmonth .......... G06K 19/077
                                                          235/441

(Continued)

FOREIGN PATENT DOCUMENTS

CN       1 311 614 A     9/2001
KR  10-2009-0011318 A    2/2009

*Primary Examiner* — Marlon Fletcher
(74) *Attorney, Agent, or Firm* — Cha & Reiter, LLC (57) ABSTRACT A board assembly includes: a circuit board; a shield member coupled to the circuit board to face the circuit board; and at least one socket for a storage medium which is mounted on the circuit board. The shield member includes an opening that exposes the entirety of the socket to the outside. The board assembly forms an opening in a dual recess structure to accommodate the socket. Thus, the board assembly may contribute to the reduction of the thickness of an electronic device while being stacked with a battery. Further, the entire socket is exposed to the outside of the shield member, the storage medium may be easily removed.

22 Claims, 5 Drawing Sheets (56) References Cited

U.S. PATENT DOCUMENTS

| | | | | |
|---|---|---|---|---|
| 6,115,243 | A * | 9/2000 | Horii | G06F 1/1616 |
| | | | | 361/679.09 |
| 7,636,245 | B2 * | 12/2009 | Clancy | G06K 7/0021 |
| | | | | 361/816 |
| 8,403,226 | B2 * | 3/2013 | Wang | G06K 7/0021 |
| | | | | 235/451 |
| 2003/0137819 | A1 * | 7/2003 | Matsushita | G06K 7/003 |
| | | | | 361/807 |
| 2003/0227763 | A1 * | 12/2003 | Kao | H04B 1/3816 |
| | | | | 361/818 |
| 2005/0239312 | A1 | 10/2005 | Pan | |
| 2007/0127220 | A1 * | 6/2007 | Lippert | G06F 1/1613 |
| | | | | 361/737 |
| 2010/0110647 | A1 * | 5/2010 | Hiew | H01L 21/565 |
| | | | | 361/752 |
| 2012/0252240 | A1 | 10/2012 | Yang | |
| 2014/0146485 | A1 * | 5/2014 | Wilhelm | H05K 7/02 |
| | | | | 361/730 |
| 2014/0240911 | A1 * | 8/2014 | Cole | G06F 1/1626 |
| | | | | 361/679.3 |
| 2014/0307410 | A1 * | 10/2014 | Jung | H05K 1/0216 |
| | | | | 361/818 |
| 2015/0091418 | A1 * | 4/2015 | Chung | H04M 1/0249 |
| | | | | 312/223.1 |
| 2015/0365508 | A1 * | 12/2015 | Kwon | H04B 1/3888 |
| | | | | 455/566 |

\* cited by examiner

BOARD ASSEMBLY

CLAIM OF PRIORITY

This application claims priority under 35 U.S.C. §119(a) from Korean Application Serial No. 10-2013-0039257, which was filed in the Korean Intellectual Property Office on Apr. 10, 2013, the entire content of which is hereby incorporated by reference.

BACKGROUND

1. Technical Field

The present disclosure relates generally to an electronic device, and more particularly, to a board assembly which is provided with a socket for inserting and mounting a storage medium such as a memory card or a subscriber identification module (SIM) card.

2. Description of the Related Art

As used herein, an electronic device refers to a device such as a portable terminal, e.g., an electronic diary (PDA), a portable multimedia player (MP3 player), a mobile communication terminal (such as a portable telephone), and a tablet PC, an image/sound device, a desktop computer, a laptop computer, or a vehicle navigation system, including a home appliance which is configured to execute a specific function according a program installed therein, for example, to output stored information as a sound or an image. Recently, various functions have been incorporated in a single mobile communication terminal as the degree of integration of such an electronic device has been increased and high capacity and high speed wireless communication has become common. For example, an entertainment function such as a game, a multimedia function such as reproduction of a music/moving image, a communication and security function for mobile banking or the like, a scheduling or calendar function, an electronic wallet function, etc. are integrated into a single electronic device, in addition to a communication function.

Also, as multimedia services using a mobile communication network are strengthened, competition for a large screen and high definition is intensified in the field of output device for electronic devices, for example, in the field of a display device. It is desired that an electronic device using a mobile communication network should be secure while being mobile, in other words, portability. Accordingly, due to demand for a large screen of a display device, efforts for securing the portability of an electronic device are concentrated to the reduction of a bezel region in a display device and the reduction of the thickness of an electronic device.

In addition, it is necessary to secure a sufficient storage capacity in an electronic device in order to store, for example, high definition images and videos, photographs, or various information. Expanding of a storage capacity in an electronic device itself often causes an increase in manufacturing costs, and hence the increase of users' purchasing cost. Accordingly, in order to allow consumers to expand a storage capacity by purchasing an additional storage medium, manufacturers mount various sockets in an electronic device.

Connectors for inserting and mounting a memory card for expanding a storage capacity and a SIM card are representative examples of connectors often mounted in an electronic device. Recently, a mobile communication terminal equipped with a dual SIM card socket has also become commercially available which allows a single device to use different mobile communication networks.

Figure 1:
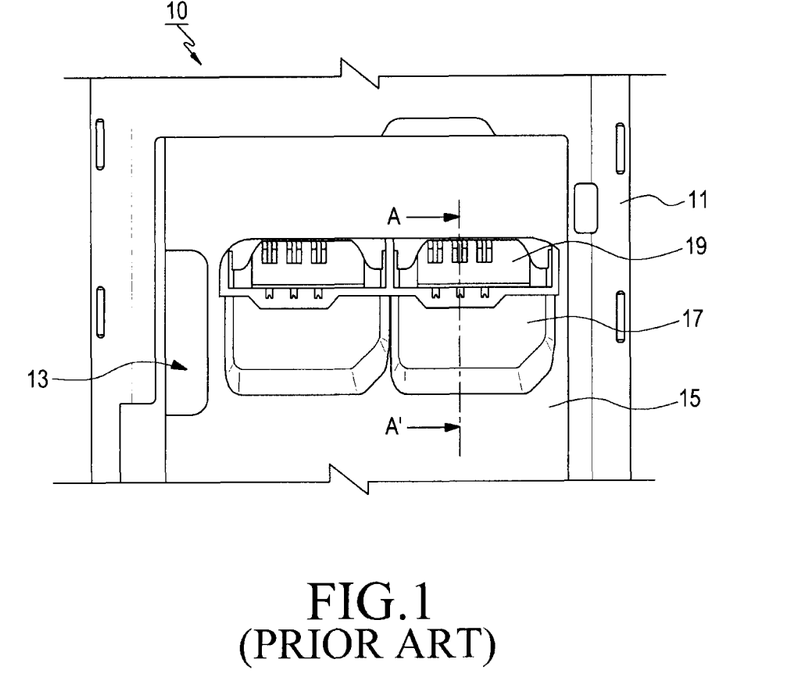
FIG. 1 is a plan view illustrating a part of a conventional electronic device.
Figure 2:
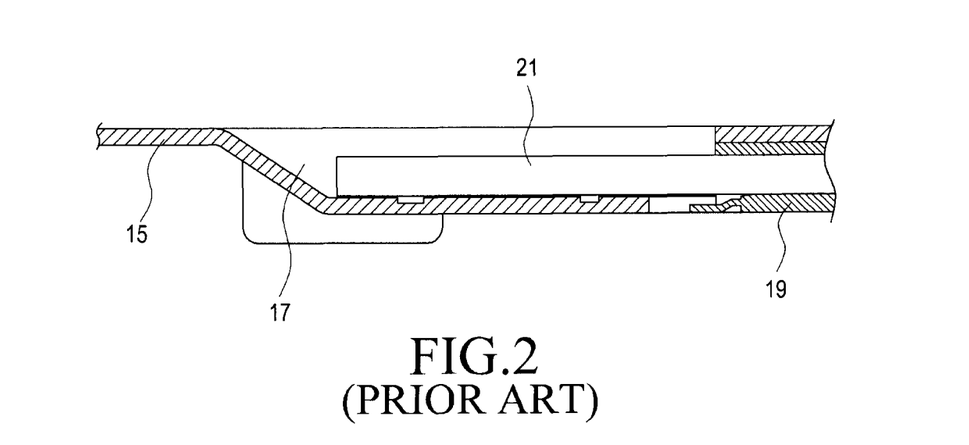
FIG. 2 is a cross-sectional view the electronic device of FIG. 1 taken along line A-A' in FIG. 1.

FIG. 1 is a plan view illustrating a part of a conventional electronic device 10, in particular, a mobile communication terminal, and FIG. 2 is a cross-sectional view of the electronic device taken along line A-A' in FIG. 1.

As illustrated in FIGS. 1 and 2, a housing 11 of the electronic device 10 provides a mounting recess 13 for mounting a battery on the rear surface thereof, and a part of the SIM card socket 19 is exposed to the mounting recess 13. The mounting recess 13 is separated from the inner space of the electronic device 10 by a shield member 15, for example, a shield can. That is, the shield member 15 forms the bottom surface of the mounting recess 13. At this time, the socket 19 is mounted inside of the shield member 15 to be only partially exposed to the outside of the shield member 15. The shield member 15 provides an accommodation recess 17 which is formed by deforming a part of the outer surface concavely. An insertion hole of the socket 19 configured to insert a storage medium 21 is connected with the accommodation recess 17 and the storage medium 21 inserted into the shield member 15 is positioned within the accommodation recess 17.

When the socket 19 or the storage medium 21 protrudes to the bottom surface of the mounting recess 13, in other words, to the outer surface of the shield member 15, a battery support surface is not flat. Accordingly, the socket 19 is positioned inside of the shield member 15 and only the insertion hole of the socket 19 is connected to the accommodation recess 17 so as to retain the bottom surface of the mounting recess 13 to be flat.

The structure in which the socket for inserting and mounting a storage medium is stacked with a battery as described above is configured such that the storage medium may be removed or mounted only when the battery is removed, and thus, the structure may prevent the electric damage of the storage medium. In other words, when the storage medium is removed or mounted while power is being supplied to the electronic device, the information stored in the storage medium may be damaged.

However, the socket arrangement structure as described above acts as a block to reduce the thickness of an electronic device such as a mobile communication terminal. Further, since the greater part of the large socket is positioned inside of the shield member and the storage medium is accommodated in the accommodation recess formed in the shield member, a user suffers from a difficulty in removing the storage medium from the socket.

SUMMARY

Accordingly, an aspect disclosed herein is to provide a board assembly for use with such electronic devices, which allow for the reduction of the thickness of the electronic device when a battery is also utilized.

Another aspect is to provide a board assembly which enables a storage medium to be easily removed and replaced.

Still another aspect of the disclosure is to provide a board assembly which may retain and secure the rigidity of a shield member while including a plurality of sockets.

According to an aspect of the present disclosure, a board assembly including: a circuit board; a shield member coupled to the circuit board having a major surface directed toward the circuit board; a socket for a storage medium mounted on the circuit board. The shield member includes an opening through which the socket extends.

According to another aspect, a board assembly includes a circuit board, a socket for a storage medium mounted on the circuit board; a shield member coupled to the circuit board facing the circuit board; a first recessed portion concavely formed on an outer surface of the shield member and provided with a bottom surface extending in a direction parallel to the insertion direction of the storage medium when inserted into the socket; at least one second recessed portion concavely formed on the bottom surface of the first recessed portion; and an opening formed in the second recessed portion. The second recessed portion is configured to receive a part of the storage medium when the storage medium is inserted into the socket.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION

Hereinafter, various embodiments of the present invention will be described with reference to the accompanying drawings. In the following description, a detailed description of known functions and configurations incorporated herein will be omitted when it may make the subject matter of the present invention rather unclear.

Figure 3:
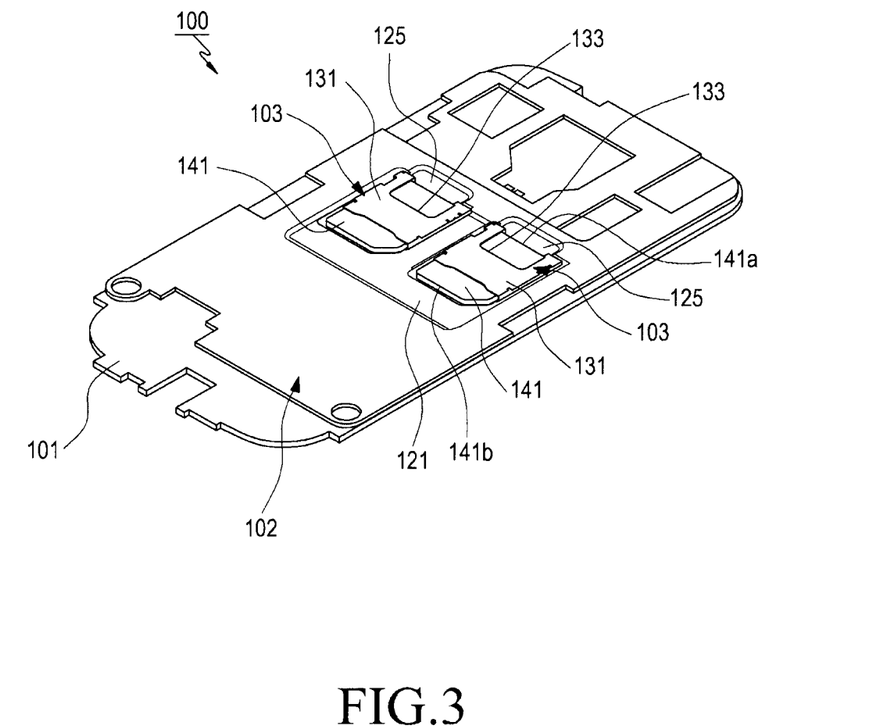
FIG. 3 is a perspective view illustrating a board assembly according to one of various exemplary embodiments of the present invention.
Figure 4:
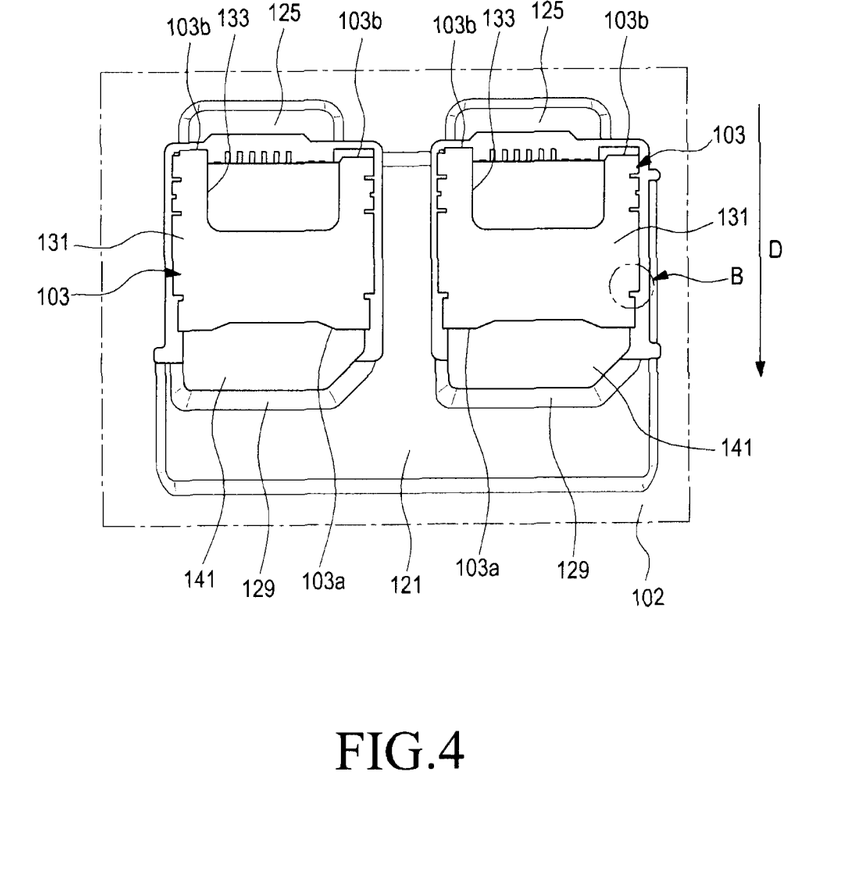
FIG. 4 is a plan view illustrating a part of the board assembly illustrated in FIG. 3.
Figure 5:
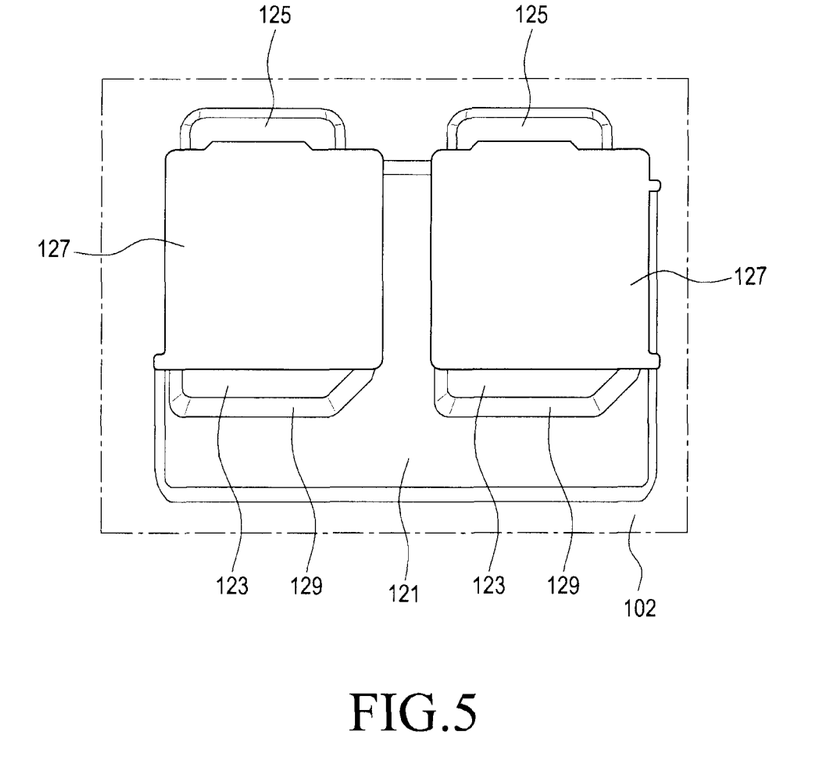
FIG. 5 is a plan view illustrating a shield member of the board assembly illustrated in FIG. 4.
Figure 6:
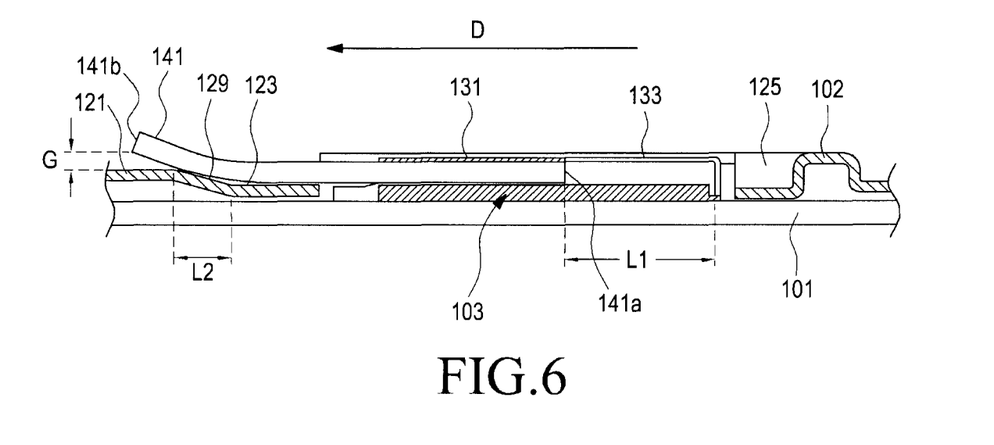
FIG. 6 is a cross-sectional view for describing a process of inserting a storage medium into or removing a storage medium from the board assembly illustrated in FIG. 3.
Figure 7:
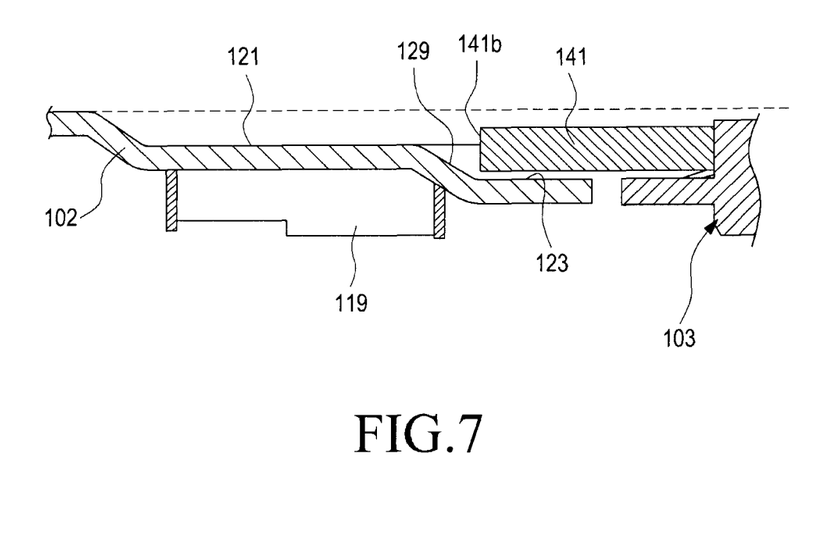
FIG. 7 is a cross-sectional view illustrating an appearance where a storage medium is inserted into and mounted on the board assembly illustrated in FIG. 3.
Figure 8:
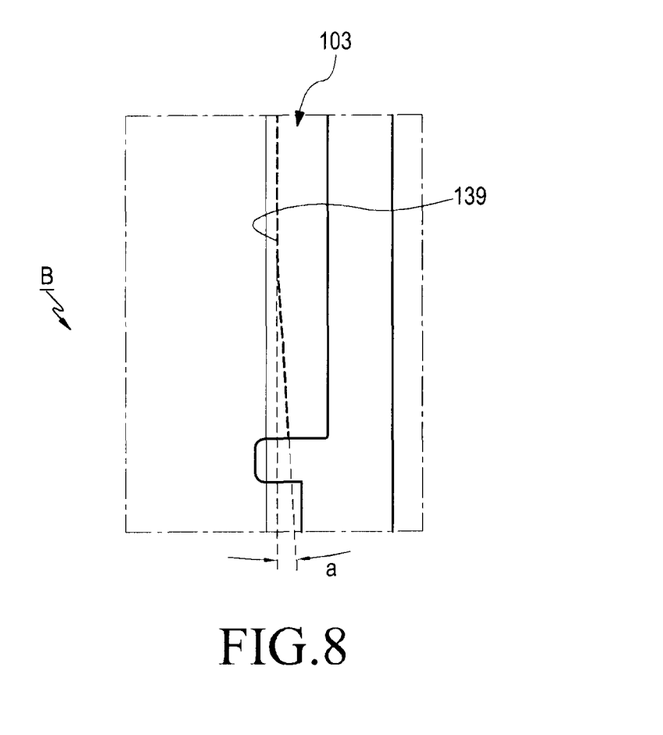
FIG. 8 is an enlarged view for the region B in FIG. 4.

FIG. 3 is a perspective view illustrating a board assembly 100 according to one of various exemplary embodiments of the present invention. FIG. 4 is a plan view illustrating a part of the board assembly 100 illustrated in FIG. 3, and FIG. 5 is a plan view illustrating a shield member 102 of the board assembly 100 illustrated in FIG. 4. In addition, FIG. 6 is a cross-sectional view for describing a process of inserting a storage medium 141 into or removing the storage medium 141 from the board assembly 100 illustrated in FIG. 3, FIG. 7 is a cross-sectional view illustrating a state where a storage medium 141 is inserted into and mounted on the board assembly 100 illustrated in FIG. 3, and FIG. 8 is an enlarged view for the region B in FIG. 4.

As illustrated in FIGS. 3 to 8, the board assembly 100 of the invention preferably includes a circuit board 101, a shield member 102, and a socket 103 mounted on the circuit board 101, in which the shield member 102 is assembled to face the circuit board 101 and includes an opening 127 (FIG. 5) configured to expose the entire socket 103 to the outside. The socket 103 may be mounted on the circuit board 101 through a surface mount process. Even in a state where the shield member 102 is assembled to the circuit board 101, the socket 103 may be mounted on the circuit board 101 through the opening 127. In other words, the opening 127 is formed in a size that may completely expose the socket 103.

The circuit board 101 may be a main circuit board of the electronic device or may be provided as an auxiliary circuit board. Typically, a plurality of integrated circuit chips including a processor configured to execute an operation and a control operation of the electronic device are mounted on the circuit board 101. The socket 103 is also typically mounted on the circuit board 101 so as to provide a means for allowing a storage medium 141, such as a memory card or a SIM card, to be mounted on and connected with the circuit board 101.

The shield member 102 is often coupled to face the circuit board 101 so as to protect the integrated circuit chips mounted on the circuit board 101 and to shield the leakage of electromagnetic waves generated by the operation of the electronic circuit chips. As illustrated in FIG. 7, a plurality of partitions 119 may be provided on the inner surface of the shield member 102 to shut out any interference among the integrated circuit chips mounted on the circuit board 101. For example, the partitions 119 can divide or separate one side of the circuit board 101 into a number of regions. Accordingly, the partitions 119 are capable of shutting out the electromagnetic wave interference among the integrated circuit chips mounted on the circuit board 101. The shield member 102 may be fabricated by a press processing of a metal sheet and the partitions 119 can made of a metal material or any other material capable of shielding from electromagnetic wave interference, e.g., ceramic. Thus, the shield member 102 and the partitions 119 may be welded or otherwise permanently joined to the inner surface of the shield member 102. As described above, the opening 127 is preferably formed through the shield member 102 and may be formed in as a pair of apertures in parallel to each other. When the shield member 102 is coupled to the circuit board 101, the opening 127 may expose a part of the circuit board 101, typically, the socket 103.

The shield member 102 may be provided with recessed portions of different heights on the outer surface thereof. Among the recessed portions, a first recessed portion 121 is typically concavely formed on the outer surface of the shield member 102, and a second recessed portion 123 is concavely formed on the bottom surface of the first recessed portion 121, such that the second recessed portion 123 is fully inside the first recessed portion 121, as shown in FIG. 5. More particularly, a single second recessed portion 123 or a plurality of second recessed portions 123 may be formed in the first recessed portion 121. Accordingly, a single opening 127 and a single socket 103 or a plurality of openings 127 and a plurality of sockets 103 may be provided in the shield member 102. The exemplary embodiment illustrated in FIGS. 3 to 5 exemplifies a configuration in which a pair of second recessed portions 123 are formed in parallel in a single first recessed portion 121.

The opening 127 is typically formed through a part of the second recessed portion 123 in the shield member 102. When a plurality of second recessed portions 123 are formed, the opening 127 can be formed in each of the second recessed portions 123 so that the openings 127 are positioned independent from each other. More particularly, the openings 127 can be formed to correspond to the number of the second recessed portions 123 and a structure of the shield member 102 is retained between the openings 127. Accordingly, the rigidity of the shield member 102 may be retained although the openings 127 are formed. Alternatively, however, it is within the scope of the invention to vary the number of openings 127 vis-à-vis the number of recessed portions, where, for example, there is a single opening 127, but more than one recessed portion 123.

The outer surface of the shield member 102 and the first recessed portion 121, and the first recessed portion 121 and the second recessed portion 123 are connected typically by inclined surfaces. This configuration of the first and second recessed portions 121 and 123 may allow for easy insertion and removal of the storage medium 141 by the user, while limiting unintentional release of the storage medium 141, by, for example, by an impact. In other words, in the storage medium 141 inserted into the socket 103, a part of the storage medium 141 which is not inserted into the socket 103 is fully accommodated into the second recessed portion 123 so that the mounted state of the storage medium 141 can be stably retained. Consequently, when the storage medium 141 is completely inserted into the socket 103, a part of the inserted storage medium 141 is accommodated in the opening 127 and the remaining portion of the storage medium 141 is fully accommodated in the remaining portion of the second recessed portion 123. In addition, as will be described below, the first recessed portion 121 allows the user to easily handle the storage medium 141 when removing the storage medium 141 from the socket 103.

Meanwhile, an operating groove 125 may be formed on the outer peripheral surface of the shield member 102. The operating groove 125 is typically positioned to adjoin the first recessed portion 121 and to be adjacent to the opening 127. As described below, when the socket 103 is disposed within the opening 127, the operating groove 125 is positioned adjacent to the insertion tail end 103b of the socket 103 (FIG. 4).

Referring to FIGS. 4, 6 and 7, the socket 103 typically includes a body and a cover unit 131 coupled to the body. Although a reference numeral is not assigned, the body is mounted on and fixed to the circuit board 101 (through the opening 127) and most often provides connection pins to be contacted with connection pads provided, for example, in the storage medium 141. The cover unit 131 fixes the storage medium 141 inserted into the socket 103 and presses the storage medium to retain electrical contact between connection pads of the storage medium 141 and the connection pins of the body. As described above, one end of the socket 103 is typically formed as an insertion hole 103a and the other end is formed as an insertion tail end 103b which is opposite to the insertion hole 103a (FIG. 4). In preferred embodiments, the storage medium 141 may be inserted into and mounted in the socket 103 only through the insertion hole 103a, i.e., the tail end 103b does not permit the storage medium 141 to be inserted therethrough. Although the insertion tail end 103b may be partially opened, at least a part of the insertion tail end 103b is usually closed to define the mounting position of the storage medium 141. More particularly, the storage medium 141 inserted into the insertion hole 103a cannot be moved in the insertion direction any more at the insertion tail end 103b because the tail end 103b does not permit the storage medium 141 to slid all the way through.

When the shield member 102 is coupled to the circuit board 101, the socket 103 is positioned within the opening 127 and the insertion hole 103a is positioned adjacent the second recessed portion 123. More specifically, the insertion hole 103a is positioned to face the inclined surface 129 that connects the first and second recessed portions 121 and 123. Each of the bottom surfaces of the first and second recessed portions 121 and 123 is formed as a flat surface parallel to the insertion direction of the storage medium 141 inserted into the socket 103, and the inclined surface 129 is inclined in relation to the insertion direction of the storage medium 141. Accordingly, as illustrated in FIG. 6, in the process of inserting or removing the storage medium 141, the storage medium 141 may be deformed slightly in the form of a curved line or curved surface as it moves along the inclined surface 129. Further, when the storage medium 141 is removed from the socket 103, the inclined surface 129 extends in the direction where the storage medium 141 may be smoothly removed. In other words, the storage medium 141 which is being removed from the socket 103 is moved while being deformed toward the outside of the shield member 102 by the inclined surface 129.

In order to ensure the easy removal of the storage medium 141 mounted in the socket 103, the socket 103 may be provided with a second opening 133. The second opening 133 may be formed by removing a part of the cover unit 131 and extends from the insertion tail end 103a. Accordingly, when the socket 103 and the shield member 102 are coupled to the circuit board 101, the second opening 133 is positioned adjacent to the operating groove 125. When it is desired to remove the storage medium 141, the user may push a tail end surface 141a of the storage medium 141 mounted in the socket 103 using a part of the user's body such as a nail through a space provided by the operating groove 125 or a tool, such as a small screwdriver. When the user pushes the tail end surface 141a at the insertion tail end 103b, the storage medium 141 is forced in the removal direction D so that the storage medium 141 is removed from the socket 103. When pushing the storage medium 141 in the removal direction D, the second opening 133 can provide a space in which the part of the user's body may remain touching the tail end surface of the storage medium 141.

Referring to FIGS. 6 and 7, when the storage medium 141 is fully inserted into and mounted in the socket 103, the storage medium 141 is fully accommodated in the second recessed portion 123. The front end 141b of the storage medium 141 is positioned adjacent to the inclined surface 129 between the first and second recessed portions 121 and 123. When the storage medium 141 starts to move in the removal direction D, the front end 141b of the storage medium 141 rides along the inclined surface 129 and the storage medium 141 starts to be deformed in the form of a curved line or curved surface.

In the direction of inserting or removing the storage medium 141, the length L1 of the second opening 133 is preferably longer than the Length L2 of the inclined surface 129. Accordingly, when the tail end 141a of storage medium 141 arrives at a position where the user can no longer touch it while being removed from the socket 103, the front end of the storage medium 141 is positioned on the first recessed portion 121. At the position where the user cannot touch the storage medium 141 on the second opening 133, the user may grasp the front end of the storage medium 141 on the first recessed portion 121 and completely separate the storage medium 141 from the socket 103. More particularly, because in this embodiment, the length L1 is larger than the length L2, when the tail end 141a is obstructed by the cover unit 131 during removal of the storage medium 141 from the socket 103 (FIG. 6), the front end 141b of the storage medium 141 is beyond the inclined surface 129, a gap G is formed in the space between the front end 141b of the storage medium 141 and the second recessed portion 123. The gap G allows for the user to grab the storage medium 141 to complete the removal.

Meanwhile, in order to ensure that the user may easily grasp the front end 141b of the storage medium 141 to separate the storage medium 141 from the electronic device 100, the length of the first recessed portion 121 may be sufficiently secured in the insertion or removal direction of the storage medium 141. More particularly, upon arriving at the position where the user cannot touch the storage medium 141 due to the second opening 133, the front end of the storage medium 141 may be spaced apart from the inclined surface between the outer surface of the shield member 102 and the first recessed portion 121 by a sufficient distance.

A structure for mounting a micro SIM card of which the length is typically in the range of about 2 to about 50 mm, more typically in the range of about 10 to about 25 mm, and preferably about 15 mm in the insertion or removal direction on the board assembly 100.

In the insertion or removal direction D of the storage medium 141, the length L1 of the second opening 133 is typically about 2 to about 20 mm, more typically in the range of about 3 to 10 mm, and preferably about 4.52 mm, the length L2 of the inclined surface between the first and second recessed portions 121 and 123 is typically about 2 to about 15 mm, more typically about 3 to about 10 mm, and preferably about 3.15 mm (which forms an inclination of about 20 degrees in the insertion or removal direction D), and the length of the bottom surface of the first recessed portion 121 is typically in the range of about 2 to about 15 mm, more typically in the range of about 3 to about 7 mm, and preferably about 4.7 mm. The "length of the bottom surface of the first recessed portion 121" refers to the length from the inclined surface between the outer surface of the shield member 102 and the first recessed portion 121 to the inclined surface 129 between the first and second recessed portions 121 and 123 in the insertion direction of the storage medium 141.

When the length L1 of the second opening 133 is set as described above, a clearance of about 3.33 mm is formed from the inclined surface between the shield member 102 and the first recessed portion 121 to the front end of the storage medium 141 when the front end of the storage medium 141 arrives at the position where the user cannot access the tail end 141a of the storage medium 141 anymore due to the interaction with the second opening 133. This occurs when the deformation caused by the interference with the inclined surface 129 has little effect on the change of the length of the storage medium 141 in the direction of inserting or removing D the storage medium 141. In fact, since the front end 141b of the storage medium 141 is interfered with the inclined surface 129 and deformed in the form of a curved line or curved surface, the clearance will be increased further. Through this clearance, the user may grasp the front end 141b of the storage medium 141 and remove the storage medium 141 from the socket 103.

Referring to FIG. 8, a part of the inner wall 139 of the socket 103, in other words, a part of the inner wall 139 of the space into which the storage medium 141 is inserted may be formed to be partially inclined by a predetermined angle "a" in relation to the insertion direction. The inclination of the inner wall 139 of the socket 103 may gradually reduce the width of the space into which the storage medium 141 is inserted along the insertion direction of the storage medium 141 from the insertion hole 103a, in other words, as approaching the insertion tail end 103b. As the inner wall 139 of the socket 103 is formed to be inclined as described above, the storage medium 141 may be easily inserted into the insertion hole 103a even if the storage medium 141 is not correctly aligned with the insertion hole 103a. Furthermore, in the fully inserted state, the storage medium 141 may be stably fixed. More particularly, the width of the insertion hole 103a can be slightly larger than the width of the storage medium 141, and as a result, insertion and correct alignment of the storage medium 141 within the socket (to ensure proper connection between the contacts of the socket 103 and the storage medium 141) is simplified for the user.

Meanwhile, as illustrated in FIG. 7, the socket 103 can be positioned lower than the outer surface of the shield member 102 from a surface where the socket 103 is mounted on the circuit board 101, and the outer surface of the socket 103 and hence, the outer surface of the storage medium 141 accommodated in the second recessed portion 123 may be positioned higher than the bottom surface of the first recessed portion 121. In this manner, when the socket 103 is disposed in an arrangement of being stacked with the battery, the socket 103 is not interfered with the battery since the socket is positioned to be lower than the outer surface of the shield member 102. In addition, since the outer surface of the storage medium 141 accommodated in the second recessed portion 123 is positioned to be higher than the bottom surface of the first recessed portion 121, the user may easily remove the storage medium 141 from the socket 103.

By forming a dual recess structure on the shield member 102 and disposing the socket 103 in the dual recess, the board 100 according to particular embodiments of the present invention may reduce the thickness at least by 0.4 mm even if the shield member 102 is fabricated using a metal sheet with the same thickness as that of a conventional shield member. If the outer surface of the socket 103 is positioned at the same height as the shield member 102, the thickness of the board assembly 100 may be further reduced.

As described above, the board assemblies according to various exemplary embodiments of the present invention may be installed where the socket is completely exposed on the shield member by forming a two step recess structure and arranging an opening configured to accommodate the socket. Accordingly, a storage medium such as a SIM card may be easily inserted or removed. In addition, since the socket is positioned at a height equal to or lower than the outer surface of the shield member, the thickness of the board assembly and hence, the thickness of the electronic device may be reduced even if the board assembly are stacked with other elements such as a battery. Further, even if a plurality of sockets are disposed on a single circuit board, it is easy to arrange openings at independent positions respectively, thereby providing a structure which may maintain the rigidity of the shield members while exposing all the sockets.

In addition, the board assembly according to various exemplary embodiments of the present invention forms an opening in a dual recess structure to completely expose the socket to the outside of the shield member while accommodating the socket. Thus, the board assembly may contribute to the reduction of the thickness of an electronic device while being stacked with a battery. Further, since the board assembly according to various exemplary embodiments is configured such that the entire socket is exposed to the outside of the shield member, a storage medium may be easily removed. Also, for a miniaturized storage medium inserted into and mounted in the socket, for example, a micro SIM card, it is possible to configure a dual SIM socket by arranging a pair of openings to be independent from and in parallel to each other. In such a case, since the structure of the shield member that separates the openings in relation to each other is retained, the rigidity of the shield member may be retained and secured while constituting the dual SIM socket. In addition, the increase of the width or length of the electronic device may be minimized while constituting the dual SIM socket.

The apparatuses and methods of the disclosure can be implemented in hardware, firmware or via the execution of software or computer code that is stored on a non-transitory machine readable medium such as a CD ROM, a RAM, a floppy disk, a hard disk, or a magneto-optical disk or computer code downloaded over a network originally stored on a remote recording medium or a non-transitory machine readable medium and stored on a local non-transitory recording medium, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor" or "microprocessor" constitute hardware in the claimed invention. Under the broadest reasonable interpretation, the appended claims constitute statutory subject matter in compliance with 35 U.S.C. §101 and none of the elements consist of software per se.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. A board assembly comprising:
a circuit board;
a shield member coupled to the circuit board having a major surface directed toward the circuit board and having a plurality of partitions arranged on an inner surface of the shield member to separate the circuit board into a plurality of regions to block electromagnetic interference among integrated circuit chips mounted on the circuit board; and
a socket for a storage medium mounted on the circuit board,
wherein the shield member includes an opening through which the socket extends.

2. The board assembly of claim 1, wherein the socket configured to accept at least one of a Subscriber Identification Module (SIM) card and a memory card.

3. The board assembly of claim 1, wherein the socket comprises a first socket, and the board assembly further comprises a second socket, the second socket mounted to the circuit board in parallel to the first socket.

4. The board assembly of claim 1, wherein the shield member comprises a first recessed portion concavely formed on an outer surface thereof, and a second recessed portion concavely formed in the first recessed portion, and the opening is formed through a part of the second recessed portion.

5. The board assembly of claim 1, wherein the socket has an inner wall disposed at an angle other than perpendicular to a line defined by an insertion hole.

6. A board assembly comprising:
a circuit board;
a shield member coupled to the circuit board having a major surface directed toward the circuit board; and
a socket for a storage medium mounted on the circuit board,
wherein the shield member includes an opening through which the socket extends;
wherein the shield member comprises a first recessed portion concavely formed on an outer surface thereof, and a second recessed portion concavely formed in the first recessed portion, and
wherein an outer surface of the socket is positioned to be lower than the outer surface of the shield member from a surface mounted on the circuit board.

7. The board assembly of claim 6, wherein the first recessed portion is a single recessed portion a pair of the second recessed portions are individually formed in the first recessed portion.

8. The board assembly of claim 6, wherein an insertion hole of the socket is connected with another part of the second recessed portion, and an inclined surface is formed between the first and second recessed portion to face the insertion hole.

9. The board assembly of claim 8, wherein when the storage medium is completely inserted into the socket, a part of the storage medium is accommodated in another part of the second recessed portion.

10. The board assembly of claim 8, wherein the socket includes a cover unit configured to cover the outer surface of the storage medium, and a second opening formed in the cover unit at an insertion tail end of the socket which is opposed to the insertion hole, wherein, a length of the second opening is longer than a length of the inclined surface.

11. The board assembly of claim 10, further comprising an operating groove concavely formed on the outer surface of the shield member,
wherein the operating groove is positioned adjacent to the second opening.

12. The board assembly of claim 8, wherein an inner wall of the socket is at least partly inclined.

13. The board assembly of claim 12, wherein a width of a space into which the storage medium is inserted is gradually reduced along a storage medium insertion direction.

14. The board assembly of claim 6, wherein the outer surface of the shield member and a bottom surface of the first recessed portion are connected with each other through an inclined surface.

15. The board assembly of claim 6, wherein a bottom surface of the first recessed portion is formed to be parallel to a storage medium insertion direction.

16. A board assembly comprising:
a circuit board;
a socket for a storage medium mounted on the circuit board;
a shield member coupled to the circuit board facing the circuit board and having a plurality of partitions arranged on an inner surface of the shield member to separate the circuit board into a plurality of regions to block electromagnetic interference among integrated circuit chips mounted on the circuit board;
a first recessed portion concavely formed on an outer surface of the shield member and provided with a bottom surface extending in a direction parallel to an insertion direction of the storage medium when inserted into the socket;

a second recessed portion concavely formed on the bottom surface of the first recessed portion; and an opening formed in the second recessed portion, wherein the second recessed portion is configured to receive a part of the storage medium when the storage medium is inserted into the socket.

17. The board assembly of claim 16, wherein the socket is positioned to be lower than the outer surface of the shield member from a surface mounted on the circuit board.

18. The board assembly of claim 16, wherein the outer surface of the socket is positioned to be lower than the outer surface of the shield member from a surface mounted on the circuit board, and the outer surface of the storage medium inserted into the socket is positioned to be higher than the bottom surface of the first recessed portion.

19. The board assembly of claim 16, wherein the socket comprises a cover unit, configured to cover the outer surface of the storage medium, the cover unit comprising an insertion hole for receiving the storage medium, and an inner wall, wherein the inner wall is disposed at an angle other than perpendicular to a line defined by the insertion hole.

20. A board assembly comprising:
a circuit board;
a socket for a storage medium mounted on the circuit board;
a shield member coupled to the circuit board facing the circuit board;
a first recessed portion concavely formed on an outer surface of the shield member and provided with a bottom surface extending in a direction parallel to an insertion direction of the storage medium when inserted into the socket;
a second recessed portion concavely formed on the bottom surface of the first recessed portion; and
an opening formed in the second recessed portion,
wherein the second recessed portion is configured to receive a part of the storage medium when the storage medium is inserted into the socket,
wherein the socket comprises a cover unit, configured to cover the outer surface of the storage medium, the cover unit comprising an insertion hole for receiving the storage medium and a second opening formed in the cover unit at an insertion tail end of the socket which is opposite to the insertion hole, and
an inclined surface facing the insertion hole of the socket and connecting the first and second recessed portions, wherein the inclined surface has a length less than the length of the second opening.

21. The board assembly of claim 20, further comprising an operating groove concavely formed on the outer surface of the shield member,
wherein the operating groove is positioned adjacent to the second opening.

22. The board assembly of claim 20, further comprising a partition protruding from an inner surface of the shield member.

* * * * *